United States Patent
Nöth et al.

(10) Patent No.: US 12,113,324 B2
(45) Date of Patent: Oct. 8, 2024

(54) HOUSING OF AN ELECTRONIC MODULE AND PRODUCTION THEREOF

(71) Applicant: Siemens Aktiengesellschaft, Munich (DE)

(72) Inventors: Christoph Nöth, Nuremberg (DE); Marius Münzinger, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/764,437

(22) PCT Filed: Jun. 18, 2020

(86) PCT No.: PCT/EP2020/066844
§ 371 (c)(1),
(2) Date: Mar. 28, 2022

(87) PCT Pub. No.: WO2021/063551
PCT Pub. Date: Apr. 8, 2021

(65) Prior Publication Data
US 2022/0407275 A1 Dec. 22, 2022

(30) Foreign Application Priority Data
Sep. 30, 2019 (EP) .................................. 19200557

(51) Int. Cl.
*H01R 13/405* (2006.01)
*B29C 45/14* (2006.01)
(Continued)

(52) U.S. Cl.
CPC ....... *H01R 43/24* (2013.01); *B29C 45/14221* (2013.01); *B29C 45/14467* (2013.01);
(Continued)

(58) Field of Classification Search
CPC .. H01R 43/24; H01R 43/18; B29C 45/14221; B29C 45/14467; B29K 2995/0005; B29L 2031/3481
(Continued)

(56) References Cited

U.S. PATENT DOCUMENTS

| | | | | |
|---|---|---|---|---|
| 4,556,275 A | * | 12/1985 | Hamsher, Jr. | H01R 12/00 439/94 |
| 4,586,607 A | * | 5/1986 | Dubbs | B29C 45/0003 206/346 |

(Continued)

FOREIGN PATENT DOCUMENTS

| | | |
|---|---|---|
| CN | 101197334 A | 6/2008 |
| CN | 101359645 A | 2/2009 |

(Continued)

OTHER PUBLICATIONS

PCT International Search Report and Written Opinion of International Searching Authority mailed Feb. 9, 2020 corresponding to PCT International Application No. PCT/EP2020/066844 filed Jun. 18, 2020.
(Continued)

*Primary Examiner* — Abdullah A Riyami
*Assistant Examiner* — Vladimir Imas
(74) *Attorney, Agent, or Firm* — Henry M. Feiereisen LLC (57) ABSTRACT

In a method for producing a housing of an electronic module, a lead with a bondable lead surface is injection molded with a plastic in a plastic injection mold such as to leave at least a part of each bondable lead surface from being injection molded and to form the lead with a pin recess which passes through the plastic and has a lead recess in the lead and which is sealed on opposing sides by a stamp component and a matrix component of the injection molded
(Continued)

tool when the injection molded tool is closed, with the stamp component and the matrix component being injection-molded after the injection molded tool is closed. An electrically conductive pin element is inserted into the pin recess such as to guide the pin element through the lead recess of the pin recess.

14 Claims, 9 Drawing Sheets

(51) Int. Cl.
 *H01R 43/18* (2006.01)
 *H01R 43/24* (2006.01)
 *B29L 31/34* (2006.01)
(52) U.S. Cl.
 CPC ...... *H01R 43/18* (2013.01); *B29K 2995/0005* (2013.01); *B29L 2031/3481* (2013.01)
(58) Field of Classification Search
 USPC .......................................................... 439/736
 See application file for complete search history.

(56) References Cited

U.S. PATENT DOCUMENTS

| | | | | |
|---|---|---|---|---|
| 4,686,766 | A * | 8/1987 | Dubbs | B29C 45/0003 |
| | | | | 264/165 |
| 4,772,761 | A * | 9/1988 | Ibrahim | H05K 5/0095 |
| | | | | 29/841 |
| 4,857,019 | A * | 8/1989 | Brubaker | H01R 12/585 |
| | | | | 29/874 |
| 4,895,530 | A * | 1/1990 | Gugelmeyer | H01R 13/623 |
| | | | | 439/387 |
| 5,168,432 | A | 12/1992 | Murphy et al. | |
| 5,647,767 | A | 7/1997 | Scheer et al. | |
| 5,879,610 | A * | 3/1999 | Beinhaur | B29C 45/14639 |
| | | | | 264/296 |
| 5,882,226 | A * | 3/1999 | Bell | H01R 13/567 |
| | | | | 439/11 |
| 6,155,886 | A * | 12/2000 | Koseki | B29C 45/14639 |
| | | | | 439/736 |
| 7,494,389 | B1 * | 2/2009 | Essert | H01L 23/49861 |
| | | | | 257/692 |
| 8,545,265 | B2 * | 10/2013 | Sakamoto | H01R 13/504 |
| | | | | 439/606 |
| 8,621,925 | B2 * | 1/2014 | Dietrich | B29C 45/14467 |
| | | | | 73/431 |
| 8,672,667 | B2 * | 3/2014 | McCusker | A61N 1/3754 |
| | | | | 425/438 |
| 10,693,248 | B2 * | 6/2020 | Teichmann | H05K 1/144 |
| 11,070,001 | B2 * | 7/2021 | Kitai | F02D 9/10 |
| 11,342,237 | B2 * | 5/2022 | Yao | H01L 23/053 |
| 2006/0061010 | A1 | 3/2006 | Huonker | |
| 2008/0001278 | A1 | 1/2008 | Matsumoto | |
| 2009/0017700 | A1 * | 1/2009 | Zart | A61N 1/3752 |
| | | | | 29/874 |
| 2009/0250796 | A1 | 10/2009 | Tsui et al. | |
| 2012/0098138 | A1 | 4/2012 | Oka et al. | |
| 2013/0009298 | A1 | 1/2013 | Ota et al. | |
| 2014/0001619 | A1 * | 1/2014 | Yoo | H01L 21/50 |
| | | | | 257/676 |
| 2014/0167235 | A1 | 6/2014 | Horie | |
| 2015/0194371 | A1 | 7/2015 | Koczwara et al. | |
| 2015/0279752 | A1 | 10/2015 | Yokoyama | |
| 2017/0194223 | A1 | 7/2017 | Egusa et al. | |
| 2017/0310067 | A1 * | 10/2017 | Omukai | B29C 45/14655 |
| 2019/0009441 | A1 | 1/2019 | Eicher et al. | |

FOREIGN PATENT DOCUMENTS

| | | |
|---|---|---|
| CN | 101587849 A | 11/2009 |
| CN | 102299084 A | 12/2011 |
| CN | 102456652 A | 5/2012 |
| CN | 102623428 A | 8/2012 |
| CN | 102891129 A | 1/2013 |
| CN | 103515364 A | 1/2014 |
| CN | 103887273 A | 6/2014 |
| CN | 104979221 A | 10/2015 |
| CN | 105047639 A | 11/2015 |
| CN | 105074919 A | 11/2015 |
| CN | 105161478 A | 12/2015 |
| DE | 19729486 A1 | 1/1999 |
| DE | 102007012818 A1 | 1/2008 |
| DE | 102008037165 A1 | 2/2010 |
| DE | 102015113438 A1 | 2/2017 |
| EP | 1559531 A1 | 8/2005 |
| EP | 1634687 A1 | 3/2006 |
| JP | S63314841 A | 12/1988 |
| JP | H0251260 A | 2/1990 |

OTHER PUBLICATIONS

Cao Yanggen et al.; "Design of Encapsulation Process and Universal MGP Mould for IC SOP Series" Publish date Nov. 3, 2008.
Tang Jialin et al:, "The Research of the Hanging Wire Bonding Process "; Publish date Aug. 15, 2016.

* cited by examiner

HOUSING OF AN ELECTRONIC MODULE AND PRODUCTION THEREOF

CROSS-REFERENCES TO RELATED APPLICATIONS

This application is the U.S. National Stage of International Application No. PCT/EP2020/066844, filed Jun. 18, 2020, which designated the United States and has been published as International Publication No. WO 2021/063551 A1 and which claims the priority of European Patent Application, Serial No. 19200557.7, filed Sep. 30, 2019, pursuant to 35 U.S.C. 119(a)-(d).

BACKGROUND OF THE INVENTION

The invention relates to a housing of an electronic module and in particular a method for producing a housing of an electronic module.

In power electronics, electronic modules adapted to special applications are required more and more frequently. Electronic modules of this type are generally manufactured in small batches, as a result of which their production is more complex and more expensive than the production of electronic modules in large-scale production with a high number of pieces. In particular, this relates to a housing of electronic modules with special terminal equipment.

Housings of electronic modules are produced by means of injection molding, for instance, wherein the terminals are injection molded with plastic. One advantage of this production method is the "bondability" of the terminal, which, during the bonding process, cannot be made to vibrate so that the bonding result can be rendered uncontrollable and due to the omission of alternative joining processes for joining the housing cannot be damaged or contaminated by joining processes of this type. However, the disadvantage is that a special plastic injection mold is required in the process for each arrangement of the terminal, which mold is adapted to the positions of the terminals.

With another method for producing housings of electronic modules, the terminals are impressed into a previously manufactured plastic frame with a relatively high speed and force. On account of the friction introduced in the process, the plastic frame fuses selectively and welds the terminals fixedly to their positions, or the material of the plastic frame yields adequately and clamps the terminals. One advantage of this method is the wide variety of terminal equipment. Even if the plastic frame has already existed for some time, the terminals can be arranged differently. The disadvantage, however, is that there is no materially bonded connection below bond pads. It can only be reliably bonded to a bond pad if a terminal pushes the bond pad onto the plastic frame in a secure and defined manner. The restricted process window and the required high mechanical tuning increase the susceptibility to error. Moreover, with this method it is not possible to use every plastic, since, for instance, high filled plastics break more easily than they selectively fuse on or deform.

With a further method, an inner and an outer frame are firstly produced as separate plastic injection molded parts. When the housing is assembled, the desired terminals are firstly inserted into the larger, outer frame. Adhesive is then applied below each bond pad and all housing parts are glued to one another. Advantages of this method include the high robustness in the production process and the variable terminal positioning. Disadvantages are the long process times and the costs involved in a second plastic component.

The object underlying the invention is to specify an improved method for producing a housing of an electronic module.

SUMMARY OF THE INVENTION

The object is achieved according to the invention by a method as set forth hereinafter.

Advantageous embodiments of the invention form the subject matter of the dependent claims.

With the inventive method for producing a housing of an electronic module, leads, which each have a bondable lead surface, are injection molded with a plastic in a plastic injection mold, wherein a pin recess, which runs through the plastic and comprises a lead recess in the lead, is generated for each lead, and wherein at least part of each bondable lead surface is not injection molded. An electrically conductive pin element is inserted into at least one pin recess, wherein the pin element is guided through the lead recess of the pin recess.

The invention enables an individual equipping of the pin recesses of the housing with pin elements, wherein a housing frame of the housing having the leads and pin recesses can be produced as a standard product. As a result, the advantages of series production of the housing frame are combined with a pin equipment which can be adapted to the respective application.

By injection molding the leads in the plastic injection mold, a process-reliable bondability of the leads is moreover enabled. With respect to impressing terminals into a housing frame, the method offers the advantage in that no special plastic, which prevents the housing from breaking when the terminal is impressed, is required in order to manufacture the housing.

In one embodiment of the invention, each pin element is connected in a form-fit manner with the lead upon insertion into a pin recess. For instance, each pin element has a tapering section, which corresponds to a lead recess with respect to its cross-section and its extent and to which a stop section of the pin element adjoins on both sides in each case, the cross-section of which is larger than a cross-section of a lead recess. The form-fit connection of a pin element with a lead is produced here by a first stop section of the pin element being pushed through the lead recess of the lead until the second stop section of the pin element abuts the lead. A form-fit connectability of the pin elements of this type with a lead in each case advantageously enables a reliable and variable pin equipment of the housing. In order to facilitate insertion and realization of a pin element in a lead recess, each pin element can have an end section, which extends with a descending cross-sectional area away from the first stop section, for instance a conical, in particular spherical, end section.

With a further embodiment of the invention, the plastic injection mold for each pin recess to be generated has a stamp component and a matrix component, which, when the plastic injection mold is closed, seal the lead recess of the pin recess on opposite skies and after closing the plastic injection mold are injection molded with the plastic. Provision can be made here for the lead recesses to be generated or enlarged by pushing the stamp component into the leads when the plastic injection mold is closed. In particular, each stamp component can have a tapering stamp end, which is pushed into a lead in order to generate or enlarge a lead recess. Furthermore, each matrix component can have a matrix end, which has a depression, which is edged by a ring-shaped wall, which, after the plastic injection mold is closed, rests against the lead and seals the lead recess on one side. As a result, the lead recesses can advantageously be generated or finished and at the same protected against a penetration of plastic during the subsequent injection molding process while the plastic injection mold is closed. The depression in the matrix end of a matrix component advantageously enables a deformation of the lead into the depression, if the stamp end of the stamp component is pushed into the lead.

With a further embodiment of the invention, each pin element has at least one thickening section, which has a diameter which is enlarged with respect to adjoining regions of the pin element, said diameter corresponding to a diameter of a pin recess outside of the lead recess. As a result, the pin elements are advantageously stabilized in the pin recesses.

With a further embodiment of the invention, each pin element is designed so that a contacting end of the pin element projects out from the pin recess after insertion into a pin recess. As a result, the pin elements can be easily contacted from the outside.

With a further embodiment of the invention, before insertion into pin recesses, the pin elements are arranged on a printed circuit board and simultaneously inserted into pin recesses.

In this way pin elements do not need to be inserted individually into pin recesses and are subsequently connected in a complex fashion with a printed circuit board. Furthermore, provision can be made for the housing to be manufactured with at least one fastening element, for instance with a thread recess, a snap-fit hook and/or a catch tappet, which is embodied in order to fasten the printed circuit board to the housing. If it is possible to fasten the printed circuit board to the housing, the afore-described form-fit connection of the pin elements with the leads can be omitted, since the pin elements are held in their position by the printed circuit board, as a result of which the printed circuit board can be replaced with the pin equipment.

With a further embodiment of the invention, the leads are produced in the form of a lead frame with a lead holder, on which the leads are arranged, and the lead holder is separated and removed from the leads after the leads are injection molded. This facilitates laying of the leads into the plastic injection mold. The lead frame can be manufactured for instance with rupture joints in order to separate the lead holder from the leads. As a result, separation of the lead holder from the leads is advantageously facilitated.

An inventive housing is produced with the inventive method.

An inventive electronic module has a housing which is produced with the inventive method. The advantages of an inventive housing and an inventive electronic module correspond to the afore-cited advantages of the inventive method.

BRIEF DESCRIPTION OF THE DRAWING

The above-described properties, features and advantages of this invention and the manner in which these are achieved will become more clearly and easily intelligible in connection with the following description of exemplary embodiments, which are explained in further detail with reference to the drawings, in which.

DETAILED DESCRIPTION OF PREFERRED EMBODIMENTS

Parts which correspond to one another are provided with the same reference characters in the figures.

FIGS. 1 to 11 show components of a housing 1 of an electronic module 3 in different stages of production of the housing 1 according to one exemplary embodiment of the inventive method for producing the housing 1.

Figure 1:
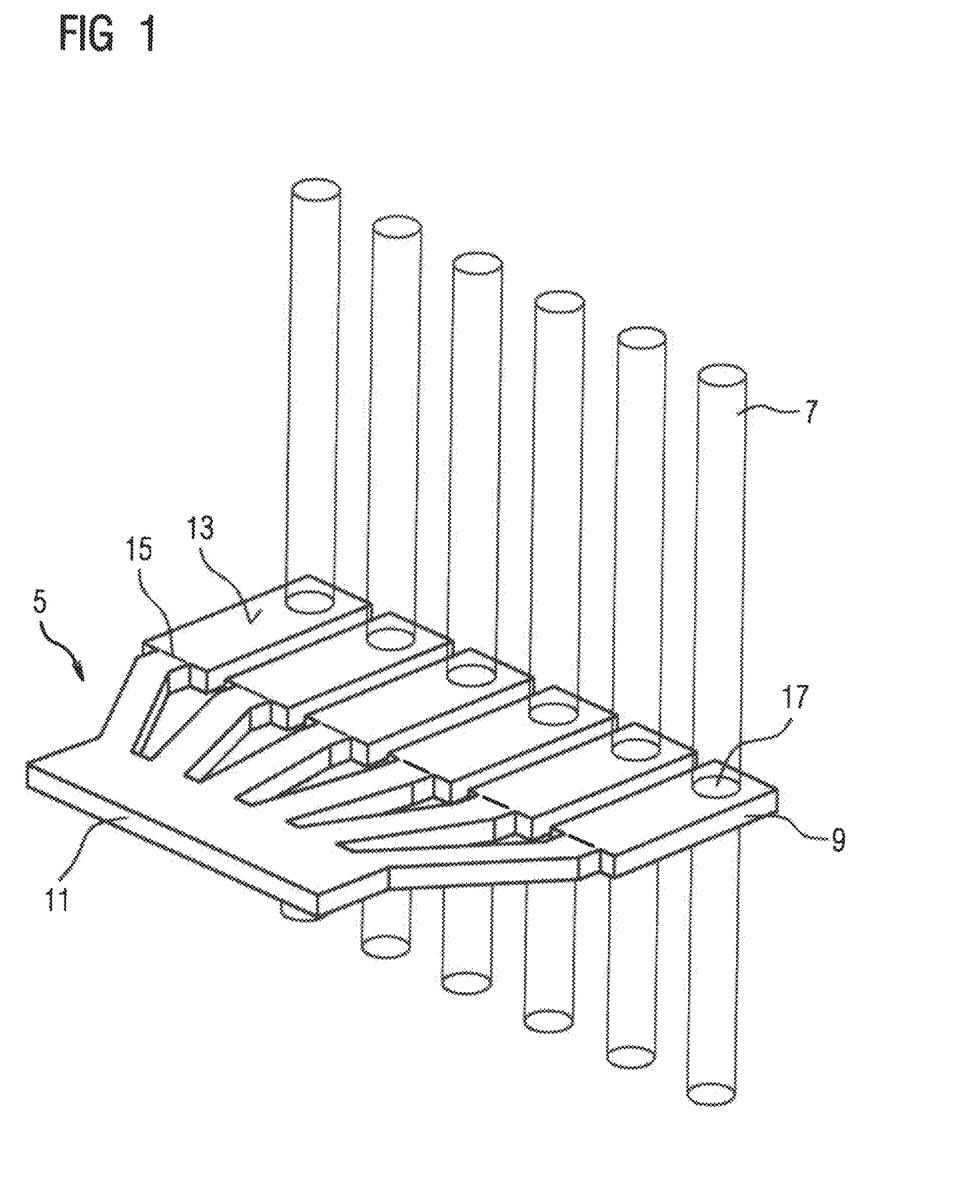
FIG. 1 shows a lead frame and pin recesses in a perspective representation.

FIG. 1 (FIG. 1) shows a lead frame 5 and pin recesses 7 in a perspective representation. The lead frame 5 comprises a number of leads 9, which are distanced from one another, and a lead holder 11, on which the leads 9 are arranged. Each lead 9 is manufactured, for instance, from copper with a nickel-plated bondable lead surface 13. The lead frame 5 has a rupture joint 15, for each lead 9, for separating the lead holder 11 from the leads 9. Each lead 9 has a lead recess 17, which is part of a pin recess 7, which runs through a housing frame 19 of the housing 1. The housing frame 19 is manufactured from plastic by means of injection molding in a plastic injection mold 20.

Figure 2:
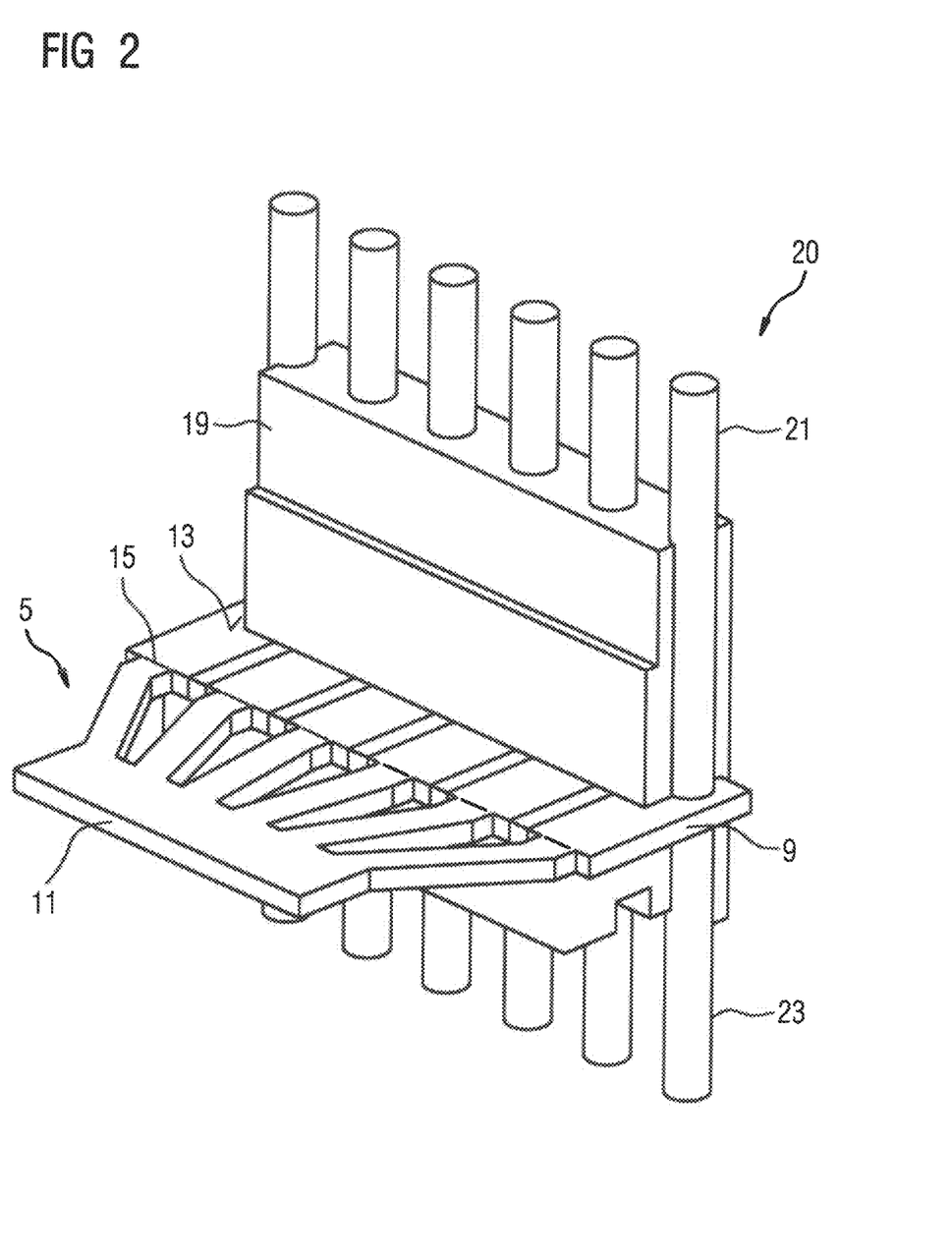
FIG. 2 shows the lead frame, a section of a housing frame and stamp component and matrix component of a plastic injection mold in a perspective representation.

FIG. 2 (FIG. 2) shows the lead frame 5, a section of the housing frame 19 and stamp component 21 and matrix components 23 of the plastic injection mold 20 in a perspective representation. Further components of the plastic injection mold 20 are not shown for the sake of clarity and are designed conventionally. The lead frame 5 is placed into the plastic injection mold 20 in order to produce the housing frame 19.

Figure 5:
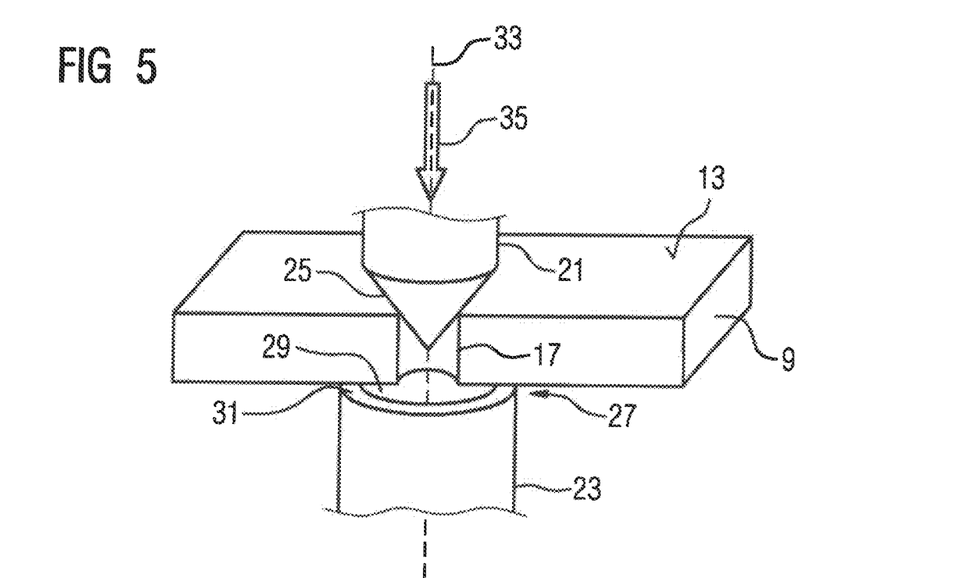
FIG. 5 shows the lead, the stamp end and the matrix end in a second position when the plastic injection mold is closed before injection molding in a representation which is similar to FIG. 3.
Figure 6:
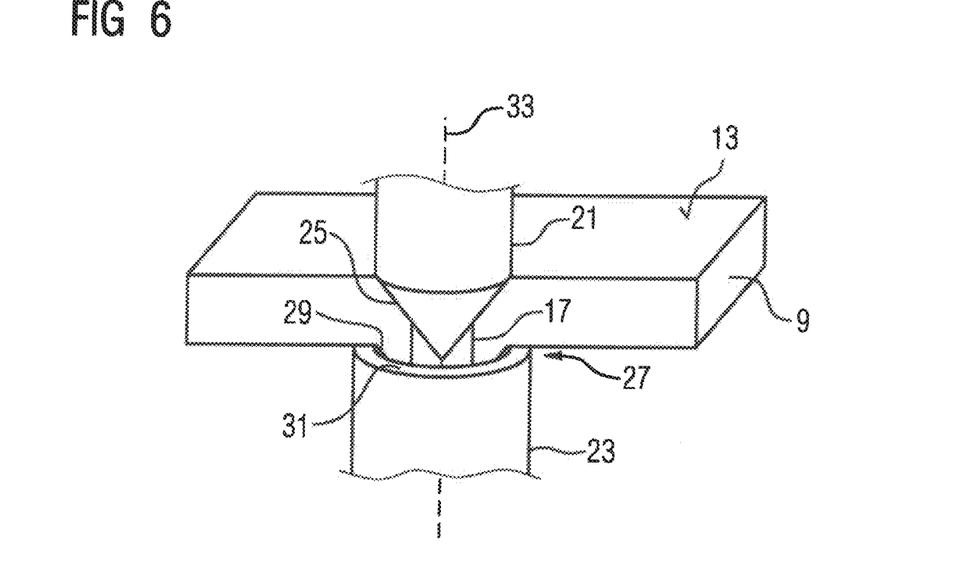
FIG. 6 shows the lead, the stamp end and the matrix end in a position during the injection molding in a representation similar to FIG. 3.

The plastic injection mold 20 is closed, wherein each lead recess 17 is enlarged and closed by a stamp component 21 and a matrix component 23, see FIGS. 5 and 6. After the plastic injection mold 20 is closed, the leads 9, the stamp component 21 and the matrix components 23 are injection molded with the plastic, wherein the intermediate spaces between the leads 9 are filled with the plastic and one part of each lead surface 13 is not injection molded, in order to enable a subsequent bonding to this part. After injection molding, the plastic injection mold 20 is opened and the lead holder 11 is separated from the leads 9 and removed at the rupture joints 15.

Figure 3:
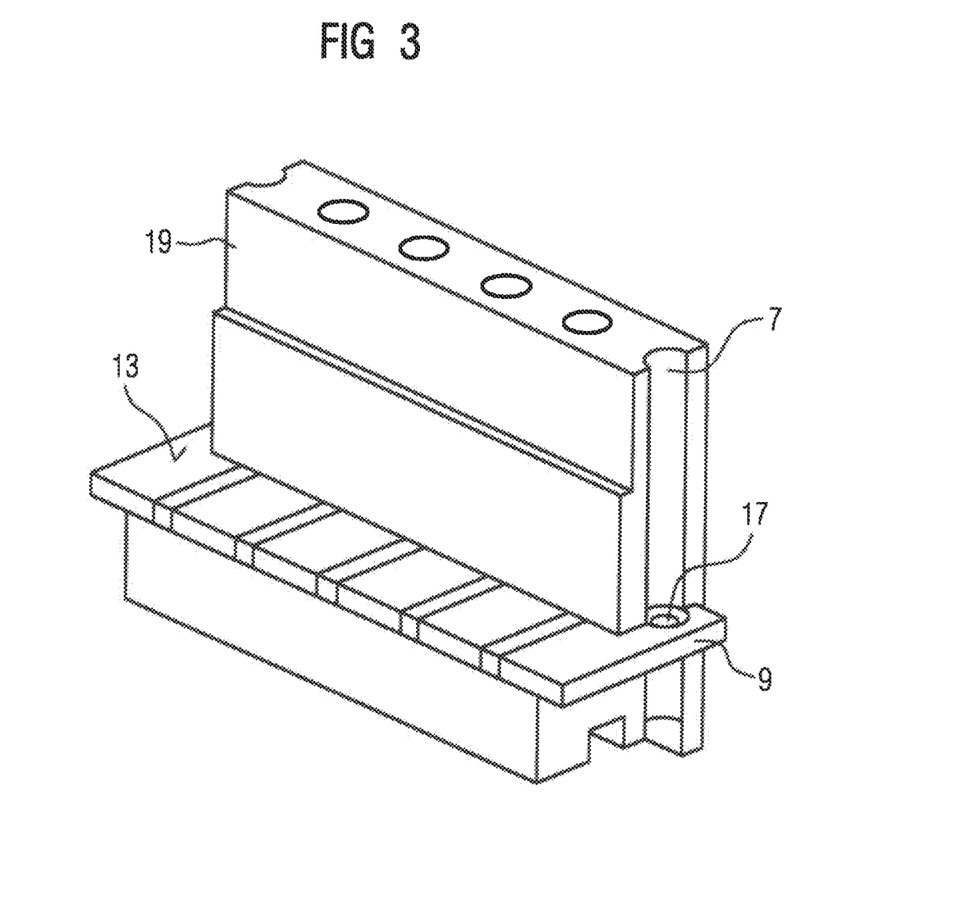
FIG. 3 shows leads and a section of the housing frame after injection molding and separation and removal of the lead holder of the lead frame in a perspective representation.

FIG. 3 (FIG. 3) shows leads 9 and a section of the housing frame 19 after injection molding and separation and removal of the lead holder 11 in a perspective representation.

FIGS. 4 to 7 (FIG. 4 to FIG. 7) show the enlarging and sealing of a lead recess 17 of a lead 9 through a stamp component 21 and a matrix component 23 in perspective representations, in which the lead 9 is shown cut in each case.

Figure 4:
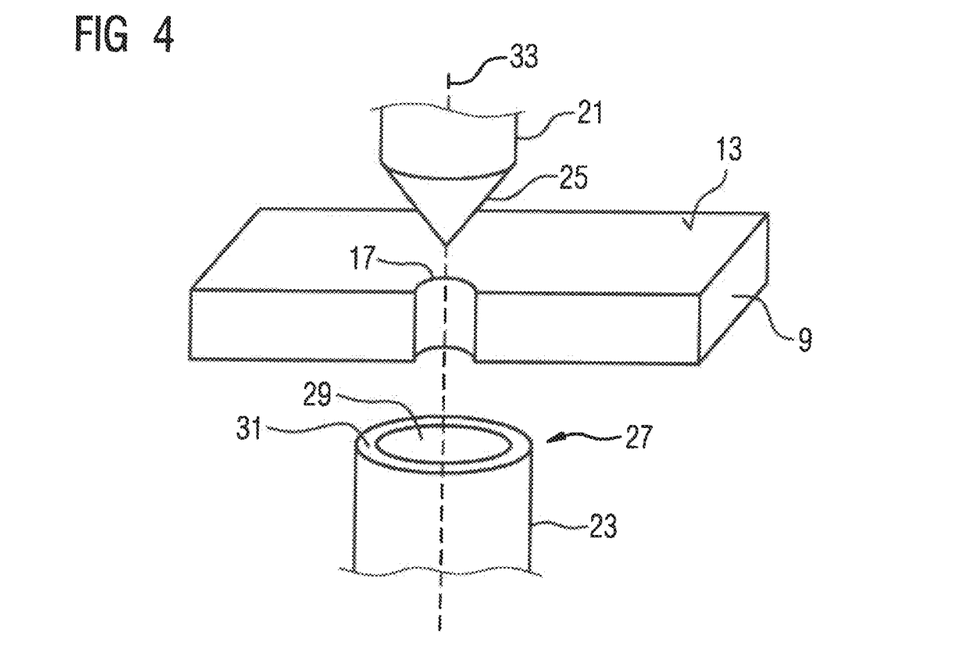
FIG. 4 shows a lead, a stamp end of a stamp component and a matrix end of a matrix component in a first position when the plastic injection mold is closed before injection molding in a perspective and partially cut representation.

FIG. 4 (FIG. 4) shows the lead 9, a stamp end 25 of the stamp component 21 and a matrix end 27 of the matrix component 23 when the plastic injection mold 20 is closed in a first position, while the stamp end 25 and the matrix end 27 on opposing sides of the lead 9 are moved toward the premanufactured lead recess 17 of the lead 9. The stamp end 25 is embodied to be conical with a tip which moves into the lead recess 17. The matrix end 27 has a depression 29, which is edged by a ring-shaped wall 31, and has a larger cross-section than the lead recess 17. Irrespective of the stamp end 25 and the matrix end 27, the stamp component 21 and the matrix component 23 are embodied to be circular cylindrical and aligned along a shared cylinder axis 33, which runs through the lead recess 17 and along which the stamp component 21 and the matrix component 23 are moved when the plastic injection mold 20 is opened and closed.

FIG. 5 (FIG. 5) shows the lead 9, the stamp end 25 and the matrix end 27 when the plastic injection mold 20 is closed in a second position, in which the stamp end 25 and the wall 31 of the matrix end 27 on opposing sides rest against the lead 9. A force is then exerted with a force direction 35 onto the stamp component 21, as a result of which the stamp end 25 is pushed along the cylinder axis 33 into the lead 9, so that the lead recess 17 is enlarged and the lead 9 in the region of the lead recess 17 is deformed into the depression 29 of the matrix end 27.

FIG. 6 (FIG. 6) shows the deformed lead 9, the stamp end 25 and the matrix end 27 in a position during the injection molding, in which the lead recess 17 is closed by the stamp end 25 and the matrix end 27.

Figure 7:
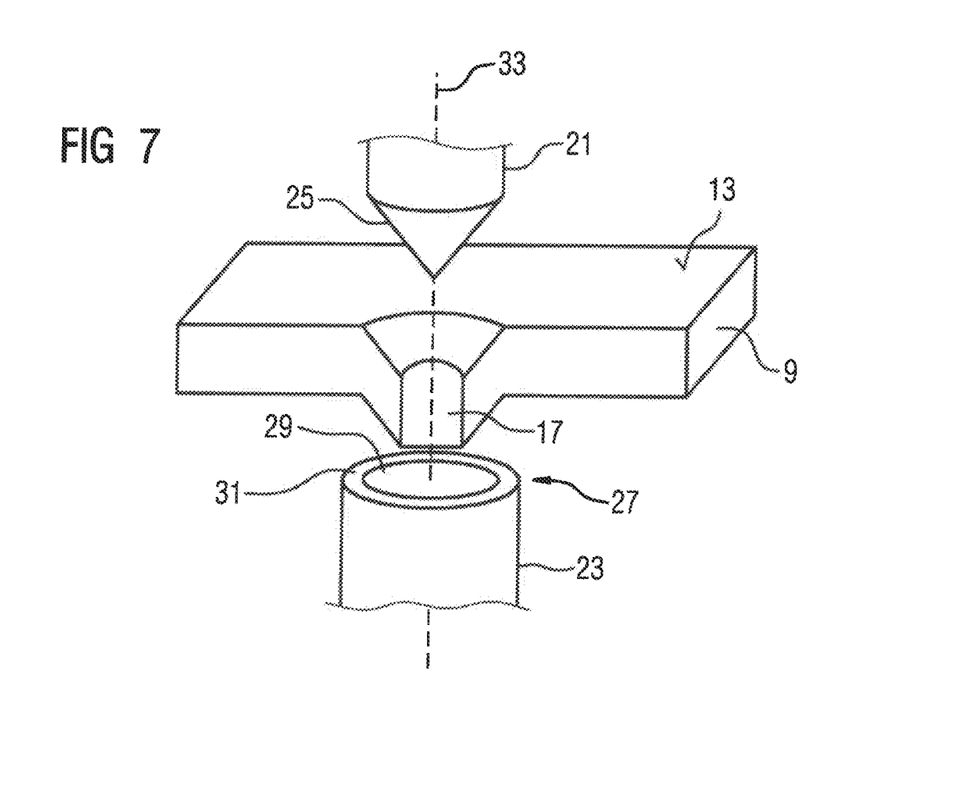
FIG. 7 shows the lead, the stamp end and the matrix end in a position when the plastic injection mold is opened after injection molding in a representation similar to FIG. 3.

FIG. 7 (FIG. 7) shows the deformed lead 9, the stamp end 25 and the matrix end 27 in a position when the plastic injection mold 20 is opened after the injection molding, in which the stamp component 21 and the matrix component 23 are moved along the cylinder axis 33 away from the lead 9 (the injected plastic is not shown) in opposite directions.

In the exemplary embodiment shown in FIGS. 4 to 7, the lead recesses 17 of the leads 9 are already premanufactured when the lead frame 5 is manufactured and enlarged and sealed, as described, when the plastic injection mold 20 is closed. In another exemplary embodiment, the lead recesses 17 are firstly generated by impressing the stamp ends 25 into the leads 9 when the plastic injection mold 20 is closed. With a further exemplary embodiment, the lead recesses 17 are premanufactured entirely during manufacture of the lead frame 5 and when the plastic injection mold 20 is closed, are only sealed by a stamp component 21 and a matrix component 23.

Figure 10:
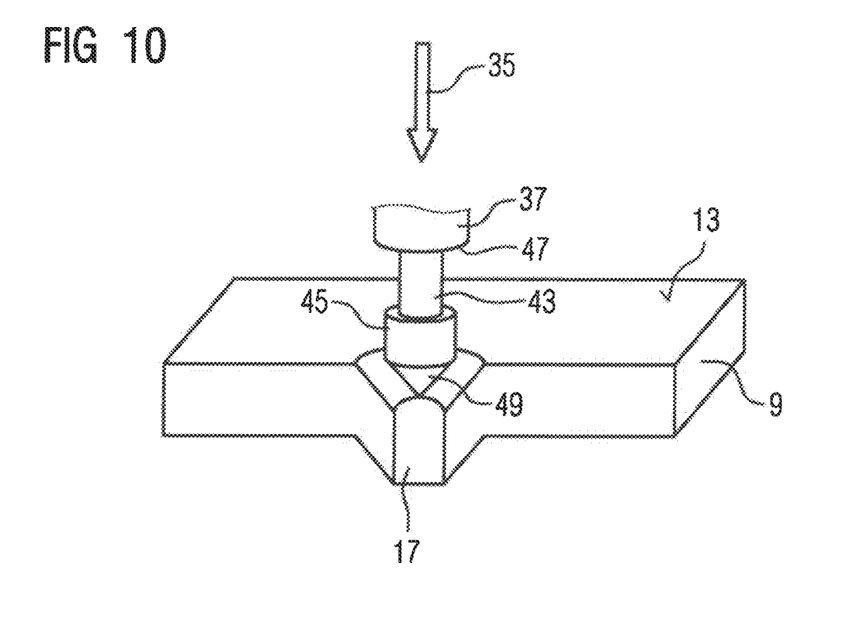
FIG. 10 shows a lead-side end of a pin element and a lead in a first position when the pin element is inserted into a pin recess in a perspective and partially cut representation.
Figure 11:
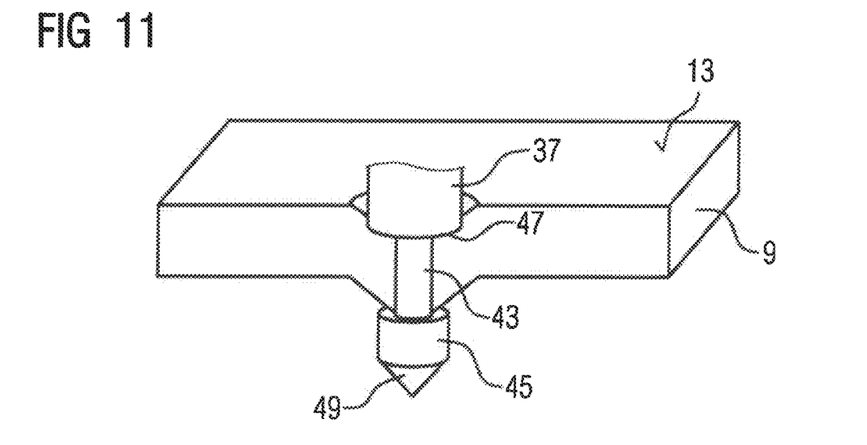
FIG. 11 shows the lead-side end of a pin element and a lead after the pin element is inserted into a pin recess in a perspective and partially cut representation.

After injection molding, pin elements 37 are inserted into pin recesses 7, wherein they are anchored in each case with a form fit to the lead recess 17 of a lead 9 (see to this end FIGS. 10 and 11).

Figure 8:
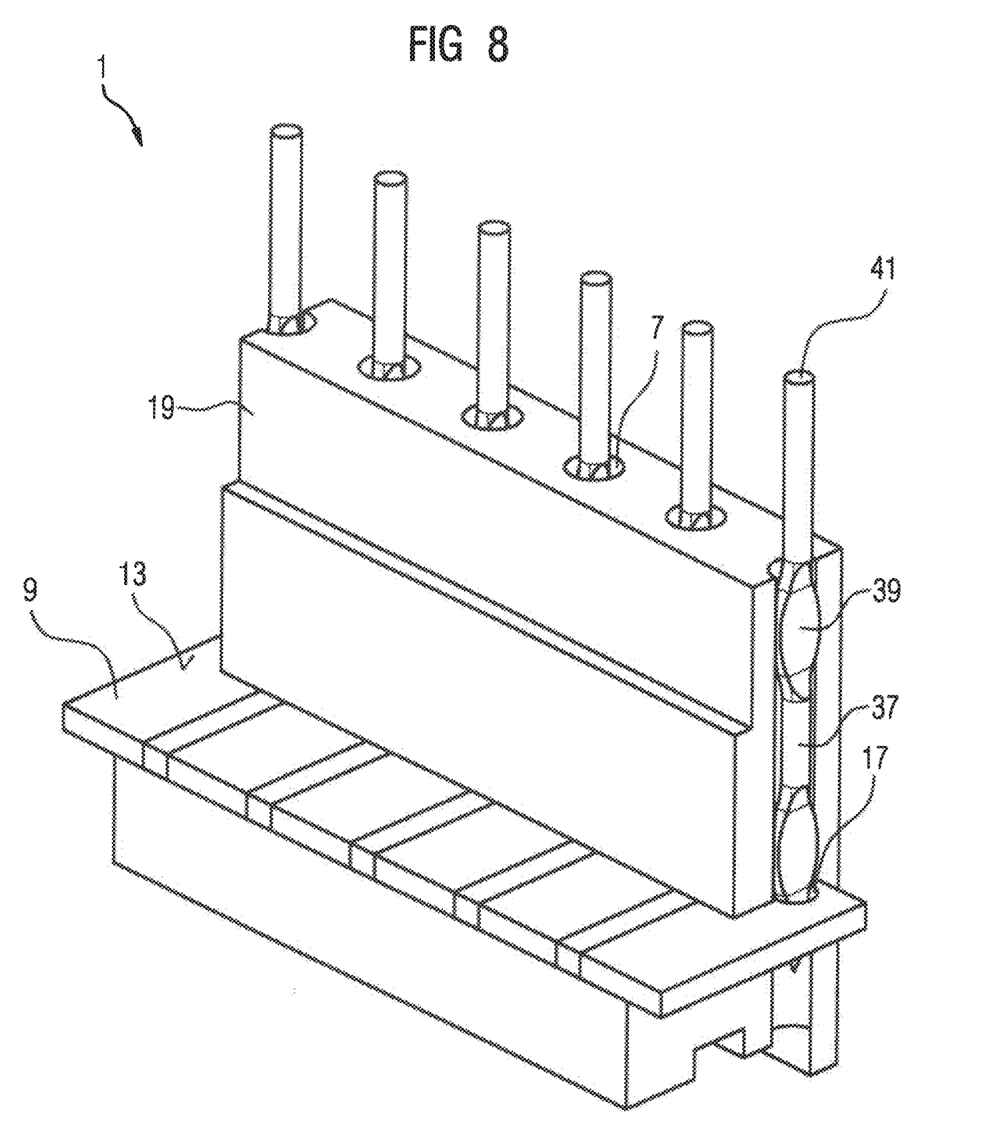
FIG. 8 shows a section of a housing of an electronic module in a perspective representation.
Figure 9:
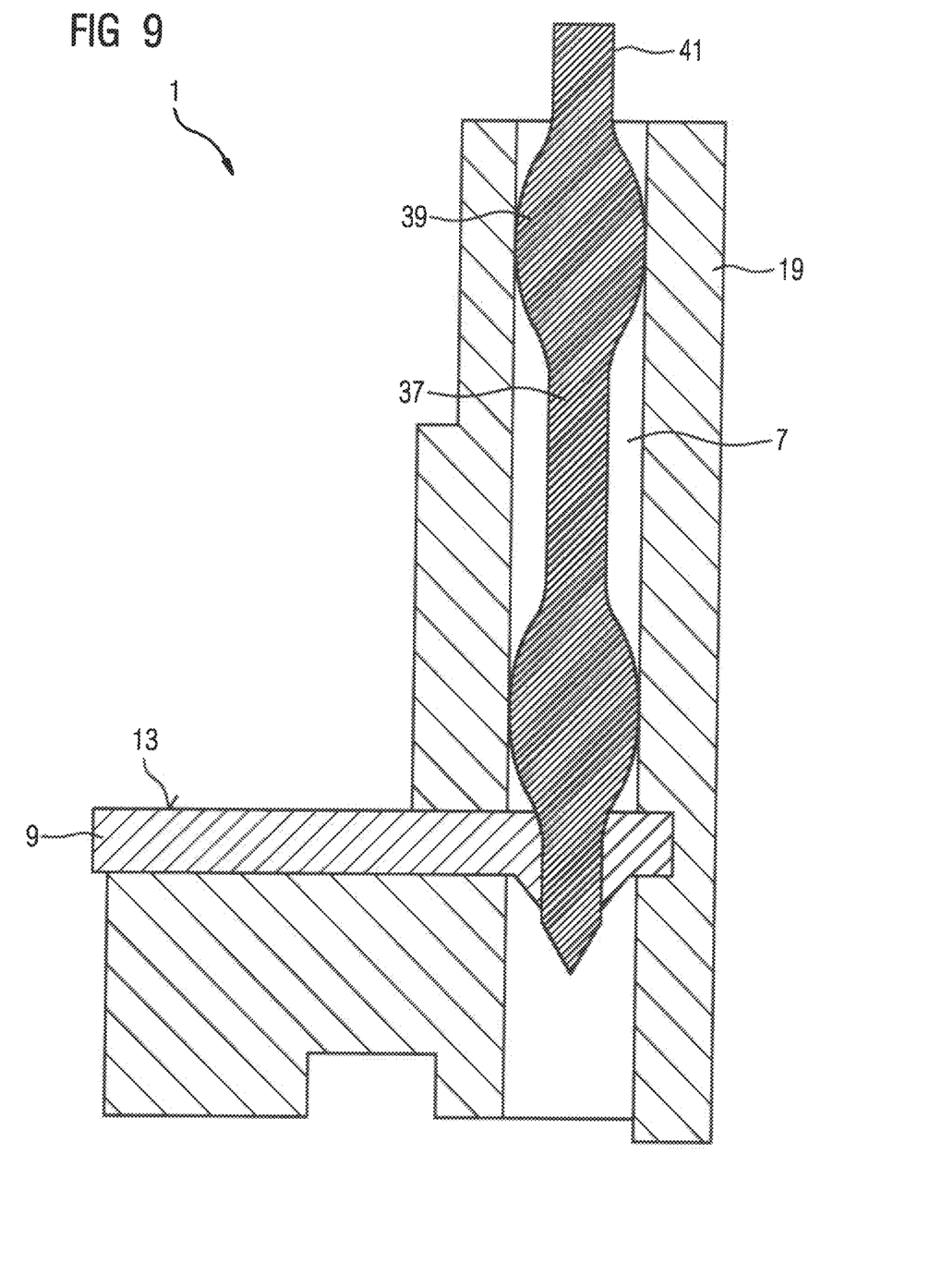
FIG. 9 shows a section of a housing of an electronic module in a sectional representation.

FIG. 8 (FIG. 8) and FIG. 9 (FIG. 9) show the housing 1 after the pin elements 37 are inserted into pin recesses 7. Here FIG. 8 shows a perspective representation of a section of the housing 1 and FIG. 9 shows a sectional representation of the housing 1. Each pin element 37 has two thickening sections 39, each of which has a diameter which is enlarged on adjoining regions of the pin element 37 and which corresponds to a diameter of the pin recesses 7 outside of the lead recess 17. The pin elements 37 are stabilized in the pin recesses 7 by the thickening sections 39. A contacting end 41 of each pin element 37 projects out from the pin recess 7 after insertion into a pin recess 7.

FIG. 10 (FIG. 10) and FIG. 11 (FIG. 11) show the lead-side end of a pin element 37 and a lead 9 when the pin element 37 is inserted into a pin recess 17 in a perspective representation, wherein the lead 9 is shown cut. The lead-side end of the pin element 37 has a tapering section 43, which corresponds to the lead recess 17 with respect to its cross-section and its extent and to which on both sides a stop section 45, 47 adjoins in each case, the cross-section of which is larger than the cross-section of the lead recess 17.

The form-fit connection of the pin element 37 with the lead 9 is produced by a first stop section 45 of the pin element 37 being pushed in the force direction 35 through the lead recess 17 until the second stop section 47 of the pin element 37 abuts the lead 9. The pin element 37 has a spherical end section 49, which extends with a descending cross-sectional area away from the first stop section 45 and facilitates pushing the pin element 37 into the lead recess 17. FIG. 10 shows the pin element 37 in a position before connection to the lead 9. FIG. 11 shows the pin element 37 after connection to the lead 9. The stop sections 45, 47 function as barbs, which prevent the connection between the pin element 37 and the lead 9 from detaching.

Figure 12:
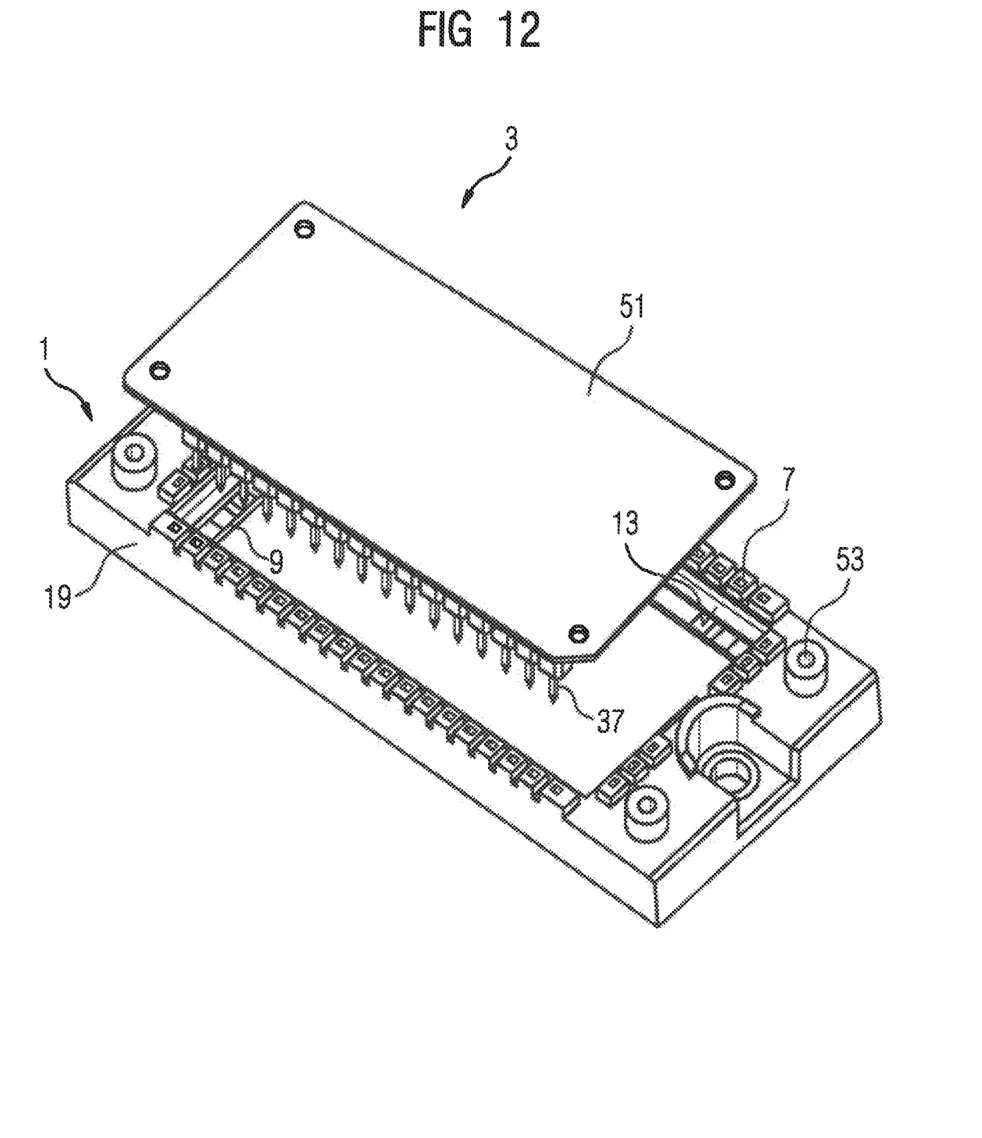
FIG. 12 shows an electronic module with a housing and a printed circuit board before the printed circuit board is assembled on a housing frame of the housing in a perspective representation.

FIG. 12 (FIG. 12) shows an exemplary embodiment of an electronic module 3 with a housing 1 and a printed circuit board 51 before the printed circuit board 51 is assembled on a top side of the housing frame 19 of the housing 1 in a perspective representation. The housing 1 is produced with a method described on the basis of FIGS. 1 to 11, wherein before insertion into pin recesses 7 the pin elements 37 are arranged (for instance by soldering) on the printed circuit board 51 and are simultaneously inserted into pin recesses 7 of the housing frame 19. The housing frame 19 is manufactured with threaded recesses 53, which are embodied for screwing the housing frame 19 to the printed circuit board 51. The electronic module 3 can have further components (not shown), for instance a base plate, which is arranged on a lower side of the housing frame 19, and/or a heat sink arranged below the housing frame 19. Furthermore, the electronic module 3 has electrical components arranged on the printed circuit board 51, the base plate and/or the heat sink, which are likewise not shown.

Although the invention has been illustrated and described hi detail on the basis of preferred exemplary embodiments, the invention is not restricted by the examples given and other variations can be derived therefrom by a person skilled in the art without departing from the protective scope of the invention.

What is claimed is:

1. A method for producing a housing of an electronic module, said method comprising:

injection molding a lead with a bondable lead surface with a plastic in a plastic injection mold such as to leave at least a part of each bondable lead surface from being injection molded and to form the lead with a pin recess which passes through the plastic and comprises a lead recess in the lead and which is sealed on opposing sides by a stamp component and a matrix component of the injection molded tool when the injection molded tool is closed, with the stamp component and the matrix component being injection molded after the injection molded tool is closed; and inserting an electrically conductive pin element into the pin recess such as to guide the pin element through the lead recess of the pin recess.

2. The method of claim 1, wherein the pin element is connected in a form-fit manner with the lead when the pin element is Inserted into the pin recess.

3. The method of claim 2, wherein the pin element has a tapering section with a cross-section and extent which correspond to a cross-section and extent of the lead recess, with a first stop section of the pin element adjoining one side of the tapering section and a second stop section of the pin element adjoining another side of the tapering section, with the first and second stop sections each having a cross-section which is larger than a cross-section of the lead recess of the lead, wherein the pin element is connected in the form-fit manner with the lead by pushing the first stop section of the pin element through the lead recess until the second stop section of the pin element abuts the lead.

4. The method of claim 3, wherein the pin element has an end section which extends with a reducing cross-sectional area away from the first stop section.

5. The method of claim 1, wherein the lead recess is produced or enlarged by pushing the stamp component into the lead when the plastic injection mold is closed.

6. The method of claim 1, wherein the stamp component has a tapering stamp end, which is pushed into the lead in order to produce or enlarge the lead recess.

7. The method of claim 1, wherein the matrix component has a matrix end with a depression which is edged by a ring-shaped wall that rests against the lead after the plastic injection mold is closed and seals the lead recess on one side.

8. The method of claim 1, wherein the pin element has a thickening section defined by a diameter which is enlarged compared with an adjoining region of the pin element and which corresponds to a diameter of the pin recess outside of the lead recess.

9. The method of claim 1, wherein the pin element is designed such that a contacting end of the pin element projects from the pin recess after insertion of the pin element into the pin recess.

10. The method of claim 1, further comprising:
arranging a plurality of said pin element on a printed circuit board before insertion of the plurality of pin elements in corresponding ones of said pin recess; and
inserting the plurality of pin elements simultaneously into the pin recesses.

11. The method of claim 10, further comprising:
manufacturing a housing with a fastening element; and
fastening the printed circuit board to the housing via the fastening element.

12. The method of claim 1, further comprising:
producing a plurality of said lead in the form of a lead frame with a lead holder, on which the plurality of leads are arranged; and
separating or removing the lead holder from the leads after injection molding the leads.

13. A housing produced with a method as set forth in claim 1.

14. An electronic module, comprising a housing produced with a method as set forth in claim 1.

* * * * *